US009625130B2

(12) United States Patent
Bishop (10) Patent No.: US 9,625,130 B2
(45) Date of Patent: Apr. 18, 2017

(54) TWO PART SURFACE MOUNT LED STRIP CONNECTOR AND LED ASSEMBLY

(71) Applicant: AVX Corporation, Myrtle Beach, SC (US)

(72) Inventor: Peter Bishop, Cambridgeshire (GB)

(73) Assignee: AVX CORPORATION, Myrtle Beach, SC (US)

(*) Notice: Subject to any disclaimer, the term of this patent is extended or adjusted under 35 U.S.C. 154(b) by 245 days.

(21) Appl. No.: 13/776,856

(22) Filed: Feb. 26, 2013

(65) Prior Publication Data

US 2013/0170197 A1    Jul. 4, 2013

Related U.S. Application Data

(63) Continuation of application No. 12/622,523, filed on Nov. 20, 2009, now Pat. No. 8,382,322.

(Continued)

(51) Int. Cl.
*F21S 4/00* (2016.01)
*F21V 21/00* (2006.01)
(Continued)

(52) U.S. Cl.
CPC .............. *F21V 21/00* (2013.01); *F21K 9/27* (2016.08); *F21S 4/20* (2016.01); *F21Y 2101/00* (2013.01);
(Continued)

(58) Field of Classification Search
CPC ........... F21Y 2101/02; F21Y 2105/001; F21Y 2103/003; F21Y 2101/00; F21Y 2103/10; F21Y 2115/10; F21V 21/005; F21V 23/004; F21V 29/22; F21V 19/001; F21V 21/00; H01R 13/7175; Y10S 362/80; F21K 9/30;
(Continued)

(56) References Cited

U.S. PATENT DOCUMENTS 4,224,522 A * 9/1980 Jackson et al. ............... 250/377
4,999,755 A    3/1991 Lin
(Continued)

FOREIGN PATENT DOCUMENTS

CN    200965165    10/2007
CN    101365272    2/2009
(Continued)

OTHER PUBLICATIONS

Examination Report issued in United Kingdom Application No. GB0921233.3 dated Aug. 31, 2012 (2 pages).
(Continued)

*Primary Examiner* — Stephen F Husar
*Assistant Examiner* — Danielle Allen
(74) *Attorney, Agent, or Firm* — Foley & Lardner LLP (57) ABSTRACT

An LED light assembly includes a plurality of LED printed circuit boards (PCB), with each LED PCB having at least one LED bulb and electrical connector pads configured at each opposite end of the boards. A two-component surface mount electrical connector is configured to connect one end of a first LED PCB to an end of a second said LED PCB such that the first and second LED PCBs are electrically connected end-to-end. The connected LED PCBs may be configured in a light tube that includes connector end caps for mounting the light tube in a light fixture.

24 Claims, 5 Drawing Sheets

Related U.S. Application Data (60) Provisional application No. 61/120,710, filed on Dec. 8, 2008.

(51) Int. Cl.
| | | |
|---|---|---|
| *F21S 4/20* | (2016.01) | |
| *F21K 9/27* | (2016.01) | |
| *F21Y 101/00* | (2016.01) | |
| *F21Y 103/10* | (2016.01) | |
| *F21Y 115/10* | (2016.01) | |

(52) U.S. Cl.
CPC ....... *F21Y 2103/10* (2016.08); *F21Y 2115/10* (2016.08); *H01L 2924/0002* (2013.01)

(58) Field of Classification Search
CPC .... F21K 9/17; F21K 9/27; F21S 2/005; F21S 4/003; F21S 48/115; F21S 4/20; H04N 5/2256; H05K 2201/10106; A42B 1/244; A47F 11/10; A61B 2560/0443; H01L 2224/73265; H01L 2924/00; H01L 23/49822; H01L 24/32; H01L 2924/0002; G11C 11/4063; H02J 9/065; G02B 6/0073; G02B 6/0095
USPC .... 362/249.02, 249.01, 249.03, 249.11, 429, 362/373, 555, 11, 231, 611, 612; 257/88; 340/815.45
See application file for complete search history.

(56) References Cited

U.S. PATENT DOCUMENTS

| | | | |
|---|---|---|---|
| 5,176,530 A | 1/1993 | Reylek et al. | |
| 5,466,174 A | 11/1995 | Savage, Jr. | |
| 5,781,414 A | 7/1998 | Mills et al. | |
| 5,848,837 A | 12/1998 | Gustafson | |
| 6,113,248 A * | 9/2000 | Mistopoulos | F21V 23/06 362/219 |
| 6,623,292 B1 | 9/2003 | Holler et al. | |
| 6,854,985 B1 * | 2/2005 | Weiss | H01R 13/2414 439/591 |
| 7,207,696 B1 | 4/2007 | Lin | |
| 7,377,669 B2 * | 5/2008 | Farmer et al. | 362/249.01 |
| 7,441,922 B2 | 10/2008 | Huang et al. | |
| 7,462,036 B2 | 12/2008 | Shin et al. | |
| 8,262,250 B2 * | 9/2012 | Li | F21V 17/007 362/219 |
| 2003/0112627 A1 * | 6/2003 | Deese | 362/249 |
| 2005/0007033 A1 * | 1/2005 | Kan et al. | 315/291 |
| 2005/0068770 A1 * | 3/2005 | Sloan et al. | 362/227 |
| 2007/0047243 A1 * | 3/2007 | Hacker et al. | 362/382 |
| 2008/0094837 A1 * | 4/2008 | Dobbins | F21K 9/00 362/249.01 |
| 2008/0298058 A1 * | 12/2008 | Kan et al. | 362/240 |
| 2010/0008090 A1 * | 1/2010 | Li et al. | 362/249.03 |
| 2010/0073929 A1 | 3/2010 | Gingrich, III | |
| 2010/0142204 A1 | 6/2010 | Bishop | |
| 2010/0142205 A1 | 6/2010 | Bishop | |

FOREIGN PATENT DOCUMENTS

| | | |
|---|---|---|
| DE | 102008034956 | 2/2010 |
| FR | 2739524 | 4/1997 |
| JP | 2001-068184 | 3/2001 |
| JP | 2002-324607 | 11/2002 |
| JP | 2008-177164 | 7/2008 |
| WO | WO-2005/106320 | 11/2005 |

OTHER PUBLICATIONS

First Office Action issued in Chinese Application No. 2009-10254018.3 dated Jul. 4, 2012 (25 pages)—English Translation included.

Non-final Office Action issued in U.S. Appl. No. 12/622,523 mailed Mar. 30, 2012 (21 pages).

Search Report for United Kingdom Application No. GB0921233.3 dated May 11, 2010 (4 pages).

Second Office Action issued in Chinese Application No. 2009-10254018.3 dated Feb. 1, 2013 (8 pages)—English Translation included.

Office Action issued in Korean Patent Application No. 10-2009-0120957 dated Feb. 2, 2016 (7 pages) English translation included.

\* cited by examiner

TWO PART SURFACE MOUNT LED STRIP CONNECTOR AND LED ASSEMBLY

CROSS-REFERENCE TO RELATED APPLICATIONS

The present application is a Continuation of U.S. patent application Ser. No. 12/622,523, filed on Nov. 20, 2009, which claims the benefit of U.S. Provisional Patent Application No. 61/120,710, filed on Dec. 8, 2008, the entire disclosure of each of which is incorporated herein by reference for any and all purposes in their respective entireties as if fully set forth herein.

BACKGROUND

The use of LED (Light Emitting Diode) lights is becoming increasingly popular in a wide variety of lighting applications. Significant advances have been made in LED lighting technology, which have made the use of LED lights more affordable and desirable in various industrial, household, and other environments requiring expanded lighting systems.

LED lights offer significant advantages over traditional incandescent lighting systems. With incandescent bulbs, the expense is not only the cost of replacement bulbs, but the labor and costs associated with frequent replacement of the bulbs. This expense can be significant where there are a large number of installed bulbs. For example, the maintenance costs to replace bulbs in large office buildings, public transportation vehicles and systems, and the like, can be quite high. These issues are substantially minimized with LED lighting systems.

The operational life of conventional white LED lamps is about 100,000 hours. This equates to about 11 years of continuous operation, or 22 years of 50% operation. This is in stark contrast to the average life of an incandescent bulb, which is approximately 5000 hours. It is thus readily appreciated that the use of LED lights virtually eliminates the need for routine bulb replacement. This advantage is even more important when the lighting device is embedded into a very inaccessible place.

It is generally recognized that, in a properly designed system, LED lights consume significantly less power than incandescent bulbs. An LED circuit has an efficiency of about 80%, which means 80% of the electrical energy is converted to light energy while the remaining 20% is lost as heat energy. In large lighting systems, the cost savings are enormous.

Unfortunately, due in part to the relatively high cost of LED lights, the art turned to fluorescent light bulbs and systems as an alternative to incandescent lights. Fluorescent lighting is about 66 percent cheaper than incandescent lighting while providing essentially the same brightness. Fluorescent lighting also lasts longer than conventional incandescent lighting. On average, a fluorescent tube has a lifespan six times longer than a regular incandescent bulb. A vast majority of commercial and industrial structures incorporate conventional fluorescent tube lighting fixtures, as do more recent residential structures. Fluorescent lighting fixtures are also used widely in public transportation systems and vehicles, trains, subway cars, planes, and so forth.

Fluorescent lights, however, have distinct disadvantages. Fluorescent lighting circuits are more complex than incandescent lighting and generally requires professional installation and expensive components. Fluorescent lighting is generally less attractive than incandescent lighting and can flicker noticeably and produce an uneven light that may bother some users. Mercury is an essential component in the manufacturing of fluorescent light tubes, and is considered hazardous by the U.S. Environmental Protection Agency due to its ability to bioaccumulate within the environment. The disposal of fluorescent light tubes is problematic for many municipalities, and a movement is underway in may locations to phase out the use of fluorescent lighting.

Increased reliance on LED lighting is thus a natural progression. However, the costs of replacing the existing fluorescent light tube fixtures and circuitry in existing structures, vehicles, systems, and so forth, is cost prohibitive. There is thus a need for a lighting system that can easily and affordably incorporate LED light devices in conventional fluorescent light fixtures. The present invention offers a unique solution to this need.

SUMMARY OF THE INVENTION

Objects and advantages of the invention will be set forth in part in the following description, or may be obvious from the description, or may be learned through practice of the invention.

In accordance with certain aspects of the invention, an LED light assembly is provided that includes a plurality of LED printed circuit boards (PCB), each of which has at least one LED bulb and electrical connector pads configured at each opposite end of the PCB. A two-component surface mount electrical connector is disposed to electrically connect one end of a first LED PCB to an end of a second adjacent LED PCB.

The surface mount connector between the adjacent LED PCBs can take on various configurations in accordance with the invention. In a particularly unique embodiment, the connector includes a socket component mounted at a first end of a LED PCB on the top surface thereof and in electrical contact with the connector pads on the LED PCB. A separate plug component is mounted at the opposite end of the LED PCB on the top surface thereof and is in electrical contact with connector pads on the LED PCB. With this unique configuration, the plug component of a first LED PCB engages into the socket component of a second LED PCB so as to electrically connect the first and second LED PCBs in an abutting end-to-end configuration.

In a particularly unique embodiment, the socket component includes an insulative body having an internal receipt channel defined therein, and at least two electrical contacts held in the insulative body. It should be appreciated that any number of contacts may be configured in the body depending on the desired contact footprint. Each electrical contact has a first section at a bottom surface of the insulative body spaced apart a distance corresponding to a separation distance of corresponding connector pads at the first end of the LED PCB, and a second section that extends into the internal receipt channel. The plug component may include an insulative base body with at least two electrical contacts that have a first section at a bottom surface of the insulative base body spaced apart a distance corresponding to a separation distance of corresponding connector pads at the second end of the LED PCB. The plug component includes any manner of plug member that extends transversely from the base body member beyond the end of the LED PCB, with the electrical contacts in the plug component having a second section that extends at least partially onto the plug member. With this configuration, for mating electrical connection between adjacent LED PCBs, the plug member extends into the receipt channel of the socket component of an adjacent LED PCB such that the electrical contacts on the plug member engage against the electrical contacts in the receipt channel of the socket component.

The socket component and plug component may be retained on the top surface of the LED PCB by any manner of surface mount technology. For example, the components may include electrical contact brackets configured with the insulative body that mount to contact pads on the PCB, for example by welding or other conventional means.

The electrical contacts in the socket and plug components can take on various shapes and configurations. In a useful embodiment, the second sections of the electrical contacts in the socket component are spring biased in the receipt channel. This bias may be the result of a bend in the contact. For example, in one embodiment, the electrical contacts in the socket component are generally U-shaped, with the first section of the contacts defined by a leg of the U-shaped contact that extends through an opening in the insulative body to the bottom surface of the body. The other leg of the U-shaped contact may bend around a portion of the body into the receipt channel, with the bend imparting a degree of spring or resiliency to the second section of the contact that engages with the plug member contact section.

In a particular embodiment, the electrical contacts in the plug component extend through an opening in a side wall of the insulative base body generally at a location where the plug member extends from the side wall, and the first section of the electrical contacts extend out of an opening in the bottom surface of the insulative base body.

In still different embodiments, the electrical contacts in the plug and socket components may be molded into the respective insulative bodies.

The present invention also encompasses an LED light tube assembly that is configured for receipt in a lighting fixture. This light tube assembly includes a light tube having an end cap connector at each opposite longitudinal end thereof. In this manner, the LED light tube assembly may resemble a conventional fluorescent light tube. A plurality of LED PCBs are connected in an end-to-end configuration within the light tube, with each of the LED PCBs having at least one LED bulb and electrical connector pads configured at each opposite end of the boards. The electrical connector pads on the extreme opposite ends of the connected boards are in electrical mating contact with the end cap connectors. As described above, a two-component surface mount electrical connector connects the connector pads of aligned ends of adjacent LED PCBs within the light tube such that one end of a first LED PCB is in electrical contact to an end of a second LED PCB. In this manner, any desired number of LED PCBs can be connected in an end-to-end manner within the light tube. Thus, various sizes and power ratings of the light tube can be easily manufactured and assembled using a standard, single size LED PCB, end cap connectors, and board connectors. Only the length of the light tube would vary to accommodate the desired number of LED PCBs.

The LED light tube assembly is particularly unique in that it can be readily configured for receipt in an existing fluorescent light fixture. The end cap connectors would include pin contacts configured for receipt in receptacles in the fluorescent light fixture. Thus, the LED light tube can be a replacement bulb for existing fluorescent light fixtures.

The invention also encompasses an electrical connector configured for connecting adjacent ends of LED PCBs within a light tube, wherein the LED PCBs have at least one LED bulb and a plurality of electrical contact pads at each end of the board. This connector may have the unique configuration and advantages as described above, and presented in greater detail herein.

Aspects of the invention are presented below by reference to particular embodiments illustrated in the figures.

DETAILED DESCRIPTION

Reference will now be made in detail embodiments of the invention, examples of which are illustrated in the drawings. The various embodiments are presented herein for sake of explaining aspects of the invention, and should not be interpreted as a limitation of the invention. For example, features illustrated or described with respect to one embodiment can be used with another embodiment to yield still a further embodiment. It is intended that the present invention include these and other modifications and variations as come within the scope and spirit of the invention.

Figure 1A:
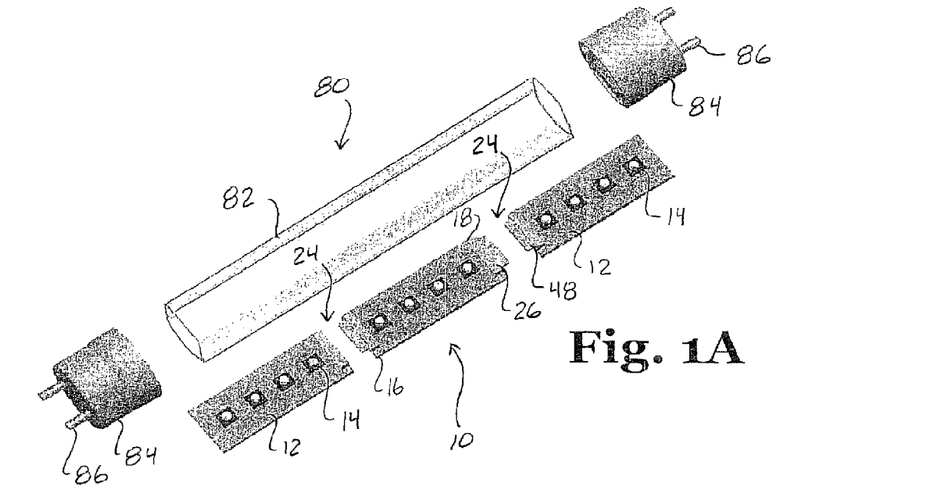
FIG. 1A is a component view of an embodiment of an LED light tube assembly.
Figure 1B:
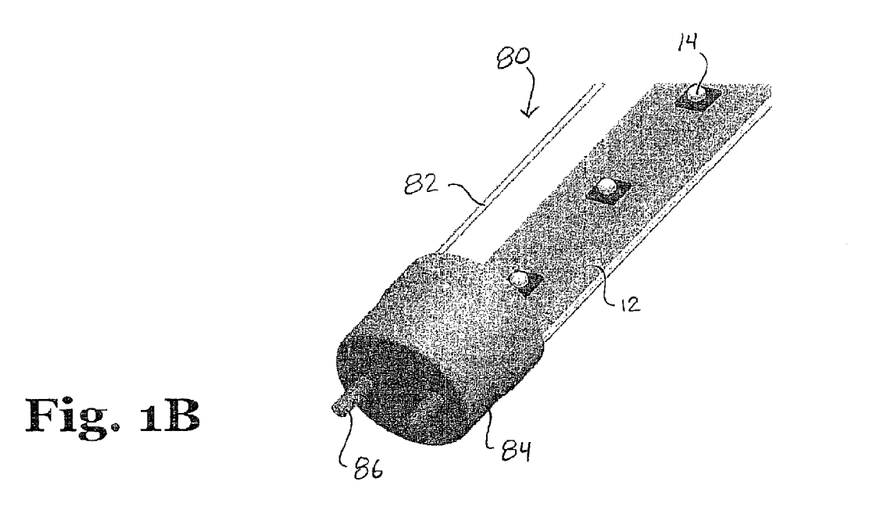
FIG. 1B is a partial assembled view of the LED light tube assembly of FIG. 1A.

FIGS. 1A and 1B illustrate a particular embodiment incorporating aspects of the invention. An LED light assembly 10 is illustrated in FIG. 1A. This assembly 10 includes a plurality of individual LED printed circuit boards (PCB) 12. Each of these boards 12 includes at least one LED bulb 14. In the illustrated embodiment, each board 12 includes four bulbs 14. The boards 12 may be manufactured so as to have a standard length, number of bulbs, and other standard dimensions. In this manner, a manufacturer need not manufacture and stock different size LED PCBs 12, which is a significant cost and manufacturing advantage. Each of the boards 12 includes a first end 16 and an opposite second 18.

Figure 5:
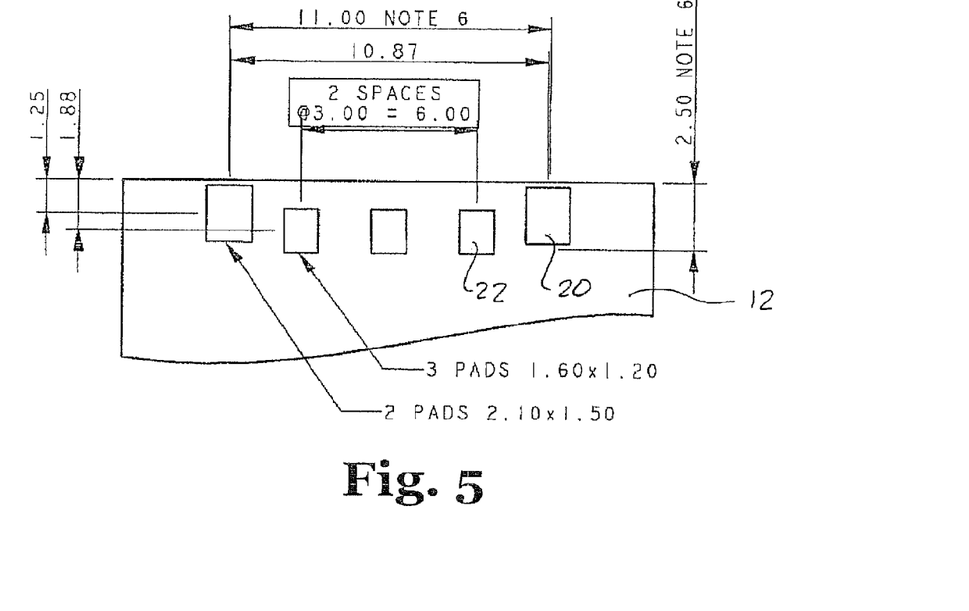
FIG. 5 is a top view of an end of a LED PCB illustrating the connector pads and bracket pads.

Each of the ends 16, 18 includes a connector pad footprint that incorporates a number of connector pads 22 (FIG. 5) and surface mount bracket pads 20 (FIG. 5). The pads 22, 20 serve to electrically connect and supply electric power to the bulbs 14 mounted on the board 12.

A more detailed view of an end of a board 12 is given in FIG. 5. In this view, three individual connector pads 22 are shown between surface mount pads 20. These pads may be made of any conventional and suitable conductive material.

For example, in a particular embodiment, the pads may be tin plated members. As in FIG. 5, dimensions are provided in certain of the figures for illustrative purposes only. It should be readily appreciated that size and dimensions are not limiting factors of the invention, and that the invention may be configured with different dimensions and sizes depending on the particular end product in which the components will be used.

Figure 3A:
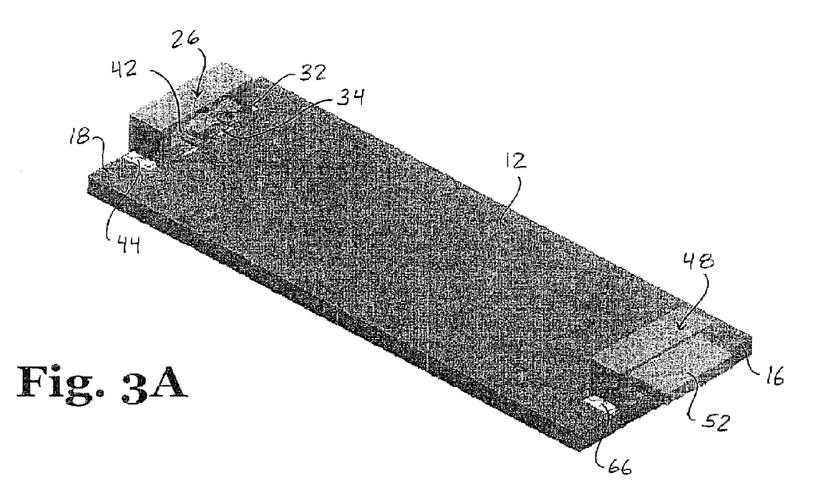
FIG. 3A is a component view of an embodiment of a two-component electrical connector and LED PCB assembly in accordance with aspects of the invention.

Referring again to FIG. 1A, a two-part surface mount connector 24 is provided between adjacent LED PCBs 12. The components of this connector 24 can take on various configurations, and serve to interconnect adjacent boards 12 in a direct abutting end-to-end configuration. In the embodiment of the connector 24 illustrated in the figures, a socket component 26 is mounted at a first end 18 of an LED PCB 12 on the top surface thereof, and is in electrical contact with connector pads 22 (FIG. 5) on the top surface of the board 12. A separate plug component 48 is mounted at the opposite end of the LED PCB 12 on the top surface thereof, and is in electrical contact with connector pads 22 on that end of the board 12. Mounting of the socket component 26 and plug component 48 on opposite ends of a board 12 is particularly illustrated in FIGS. 3A and 3B. With this unique two-part socket and plug component connector 24, the plug component 48 of a first board 12 engages into the socket component 26 of a second board 12, as indicated by the arrows in FIG. 3B, so as to electrically connect the first and second LED PCBs 12 in an abutting end-to-end configuration.

In one embodiment as illustrated in the figures, the socket component 26 includes an insulative body 28 having an internal receipt recess or channel 30 defined therein. The insulative body 28 can take on various shapes and sizes, and is generally formed of any suitable insulative material, such as nylon-46. Other insulative materials are well known to those skilled in the art and may be used in the components of a connector 24 of the present invention.

At least two electrical contacts 32 are held in the body 28 of the socket component 26. Any number of contacts 32 may be configured in the body 28 depending on the desired contact footprint (i.e., a 2-way, 3-way, 4-way contact, and so forth). Each of the contacts 32 has a first section 34 disposed at a bottom surface 38 of the body 28 that engages against the contact pads 22 on the board 12. The upper sides of these contact sections 34 are visible in the socket components 26 illustrated in FIGS. 3A and 3B (with the bottom sides being disposed against the contact pads 22 on the board 12). The first sections 34 are spaced along the bottom surface of the body 28 a distance corresponding to a separation distance of the corresponding connector pads 22 (FIG. 5) at the respective end of the LED PCB 12.

Figure 2A:
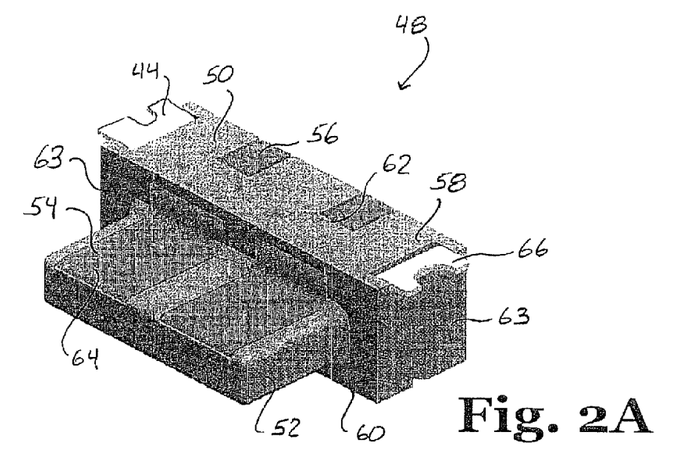
FIG. 2A is a perspective view of an embodiment of a plug component of a two-part surface mount electrical connector for an LED PCB assembly in accordance with aspects of the invention.
Figure 2B:
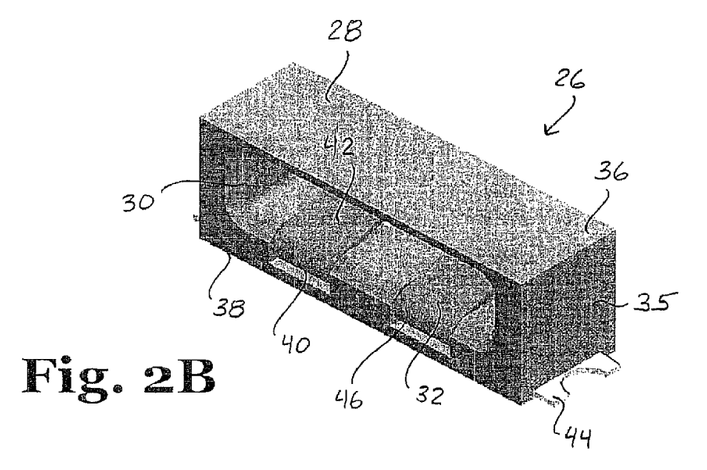
FIG. 2B is a perspective view of an embodiment of a socket component that mates with the plug component of FIG. 2A.

Contacts 32 in the socket component 26 may include a second section 42 that extends into the internal receipt channel 30, as particularly illustrated in FIG. 2B. This section 42 may be spring biased in the receipt channel 30 as the result of a bend 46 in the contact 32. For example, in the illustrated embodiment, the contact 32 is a generally U-shaped strip member with the first section 34 of the contact 32 being defined by one of the legs of the U-shaped member that extends through an opening or slot 40 in the body 28 near the bottom surface 38 of the body. The other leg of the U-shaped contact 32 is defined by the bend 46 and extends into the receipt channel 30, with the bend 46 imparting a degree of spring or resiliency to the second section 42. The U-shaped contact 32 may bend around a post or portion of the body 28, or the contact 32 may be retained in slots or other engaging structure defined in any portion of the body 28. It should be readily appreciated that any suitable means may be employed to retain the contacts 32 within the body 28. For example, the contacts 32 may be molded into the body 28, or retained by any mechanical means.

The plug component 48 may include an insulative base body 50 having at least two electrical contacts 54 retained thereby. The contact 54 may have a first section 56 disposed at a bottom surface 58 of the body and spaced apart a distance corresponding to a separation distance of corresponding connector pads 22 (FIG. 5) at the second end of the LED PCB 12, as particularly illustrated in FIGS. 2A and 4B. The plug component 48 may include any manner of extension or plug member 52 that extends transversely from the base body 50 beyond the end of the LED PCB 12, which relationship is particularly illustrated in FIGS. 3A and 3B. The electrical contacts 54 in the plug component 48 have a second section 64 that extends at least partially onto the plug member 52, as illustrated in FIGS. 2A and 4B. For example, the electrical contacts 54 may extend through an opening in a side wall 63 of the base body 50 generally at a location where the plug member 52 extends transversely from the side wall 63. A portion of the contact defining the first section 56 may extend out of an opening 62 in the bottom 58 of the body 50, as seen in FIGS. 2A and 4B. Thus, the contacts 54 may include any number of bends to accommodate this configuration within the body 50 and along the plug member 52. As with the socket components 26, the contacts 54 may be retained in the plug component 48 by any suitable means. For example, the contacts 54 may be molded directly into the plug component 48, or retained by any suitable mechanical means.

Figure 3B:
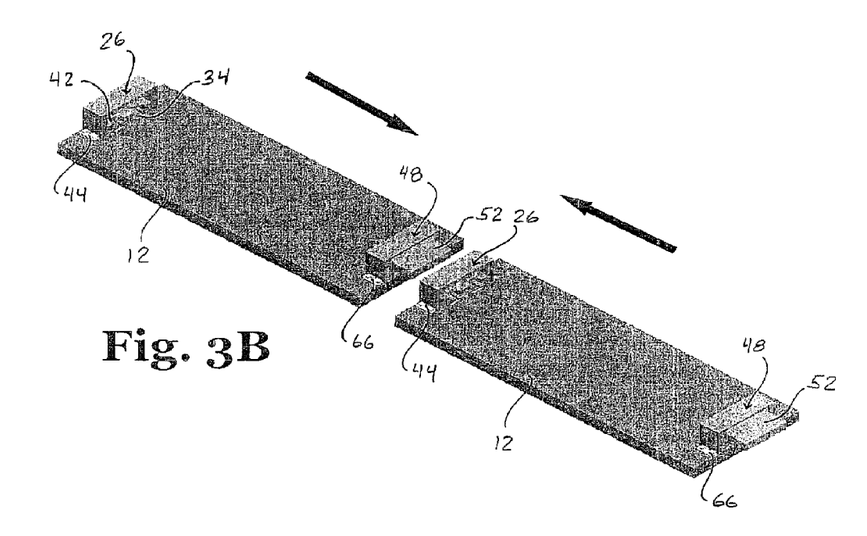
FIG. 3B is a perspective view of multiple assemblies of the type of FIG. 3A in pre-connected state; an assembled view of the components of FIG. 2A.
Figure 4A:
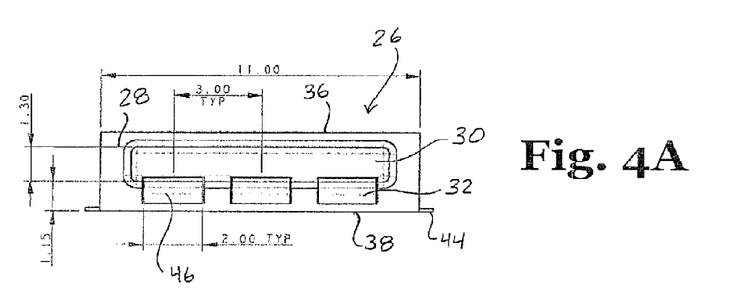
FIG. 4A is a side view of an embodiment of a socket component of a connector.
Figure 4B:
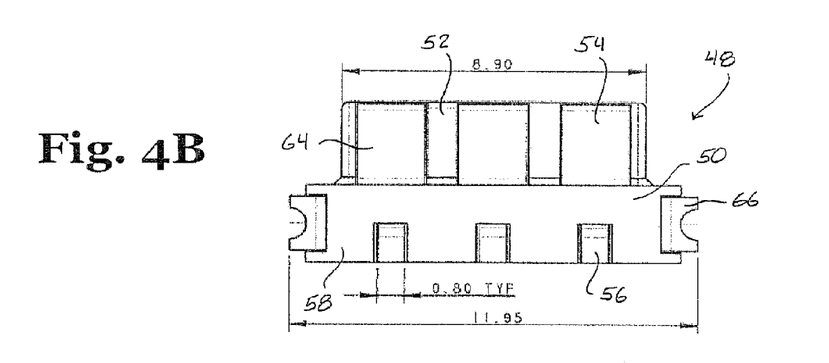
FIG. 4B a bottom view of an embodiment of a plug component of a connector; cut-away side view of the assembled components of FIG. 2B.
Figure 4C:
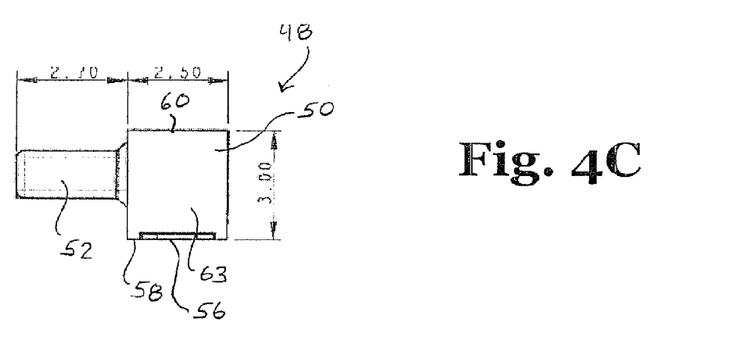
FIG. 4C is a side view of the plug component of FIG. 4B.

Referring to FIG. 3B, it is readily appreciated that for mating electrical connection between adjacent LED PCBs 12, the plug member 52 on one end of a first board 12 slides into the receipt channel 30 in the socket component 26 mounted to the end of an adjacent board 12. The second section 64 of the contacts 54 exposed on the plug member 52 along the bottom surface of the plug member engage in sliding frictional contact with the second sections 42 of the contacts 32 in the socket component 26, which face upward in the channel 30.

The socket 26 and plug 48 components may be retained on the top surface of the LED PCBs 12 by any suitable surface mount technology. For example, in the illustrated embodiments, the socket 26 includes surface mount brackets 44, and the plug component 48 includes surface mount brackets 66, for mounting onto contact pads 20 (FIG. 5) on the PCB 12, by welding or any other conventional means known and practiced in the art.

It should be readily appreciated that the two-part connector 24 described herein is not limited in any way to a particular construction material. In a desirable embodiment, the various contacts may be, for example, copper alloy with selective gold over nickel tin plated on the contact tails. The surface mount brackets may be, for example, a tin plated copper alloy. The insulative body components may be, for example, nylon-46.

It should be appreciated that the individual contacts may be retained in the insulative bodies 28, 50 of the socket 26 and plug 48 components by any other suitable means. For example, the contacts 40 may be directly molded into the bodies, or retained by other mechanical means.

Referring to FIG. 3B, it can be seen that the electrical connector 24 between the adjacent LED PCBs 12 allows for zero spacing between the boards. In other words, the boards 12 abut in a direct contact, end-to-end configuration. This may be an important consideration when space within a light tube is limited. Also, the distance between LED bulbs 14 is uniform along the length of the connected boards 12 since the connector 24 does not add additional space between the boards 12.

The present invention also encompasses an LED light tube assembly 80, as particularly illustrated in FIGS. 1A and 1B. This assembly 80 includes a light tube 82 that may be, for example, glass, plastic, or any other type of suitable clear or translucent material. The assembly 80 includes an end cap connector 84 at opposite ends of the tube 82. Each of these connectors 84 includes any manner of external electrical connection component, such as pins 86. These pins 86 engage into a power supply socket in a conventional light fixture, such as any manner of conventional fluorescent light fixture. A plurality of LED PCBs 12 are connected in an end-to-end configuration within the light tube 82, as conceptually illustrated in FIG. 1A wherein three boards 12 are illustrated. Connector pads 22 on the extreme ends of the connected boards 12 engage in a corresponding socket or other connector component within the end cap connectors 84. Thus, in this manner, a complete electrical circuit is defined from one end cap connector 84, through the interconnected boards 12, and to the opposite end cap connector 84.

Referring again to FIG. 1A, it should be appreciated that various sizes and power ratings for a light tube assembly 80 can be easily manufactured and assembled using a standard size LED PCB, end cap connectors 84, and surface mount board connectors 24. Only the length of the light tube 82 would need to vary to accommodate an increased or decreased number of LED PCBs 12. The light tube assembly 80 particularly illustrated in FIG. 1A is unique in that it resembles a conventional fluorescent light bulb and can be readily configured for receipt in an existing fluorescent light fixture. Thus, the LED light tube assembly 60 can act as a replacement bulb for existing fluorescent light fixtures.

It should also be readily appreciated that the invention also encompasses a two-part surface mount electrical connector 24 configured for connecting adjacent ends of LED PCBs 12 within a light tube 82 or other type of light fixture, as described above.

It should be readily appreciated by those skilled in the art that various modifications and variations can be made to the present invention without departing from the scope and spirit of the invention as set forth in the claims and their equivalents.

What is claimed is:

1. A light assembly comprising:
   a first printed circuit board (PCB) including:
      a first light emitting element;
      a first electrically-conductive pad comprising an electrically-conductive flat surface parallel to a surface of the first PCB; and
      a socket component positioned at an end of the first PCB, wherein the socket component includes:
         an insulative body having a recess formed therein; and
         a first electrical contact having a first section formed adjacent to the surface of the first PCB and a second section extending within the recess, wherein the first section is electrically connected to the first electrically-conductive pad;
         a second electrical contact spaced apart from the first electrical contact by a separation distance corresponding to a distance between the first electrically-conductive pad on the surface of the first PCB and a second electrically-conductive pad on the surface of the first PCB;
         wherein the first electrical contact is U-shaped, and wherein the first section of the first electrical contact is defined by a leg of the U-shaped first electrical contact that extends through an opening in a body of the socket component to a bottom surface of the body of the socket component and
   a second PCB coupled to the first PCB, wherein the second PCB includes:
      a second light emitting element;
      a third electrically-conductive pad; and
      a plug component positioned at the end of the second PCB, wherein the plug component includes:
         a plug member extending outward from the end of the second PCB; and
         a third electrical contact having a first section formed adjacent a surface of the second PCB and a third section positioned on a surface of the plug member, wherein the first section is electrically connected to the third electrically-conductive pad.

2. The light assembly of claim 1, wherein the plug component is configured to seat within the socket component such that no gap is formed between the first PCB and the second PCB.

3. The light assembly of claim 1, wherein the second PCB further comprises a body member extending from a top surface of the second PCB such that the body member does not extend outward from the end of the second PCB, and wherein the plug member extends from a side of the body member.

4. The light assembly of claim 3, wherein the plug member of the plug component extends to a lesser height from the top surface of the second PCB than the body member.

5. The light assembly of claim 3, wherein the third electrical contact extends from a bottom surface of the body member through an opening in a side wall of the body member and into the plug member.

6. The light assembly of claim 1, wherein the first electrical contact of the socket component is configured to engage the third electrical contact of the plug component upon mating of the socket component with the plug component.

7. The light assembly of claim 1, wherein the socket component and the plug component each include surface mounting brackets positioned at respective bottom surfaces thereof, and wherein the surface mounting brackets are configured to mount the socket component and the plug component to the surface of the first PCB and the second PCB, respectively.

8. The light assembly of claim 1, wherein the second section of the first electrical contact is spring biased within the recess of the socket component.

9. The light assembly of claim 1, wherein the first electrical contact and the second electrical contact are molded into a surface of the socket component and a surface of the plug component, respectively.

10. The light apparatus of claim 1, wherein the first light emitting element comprises a light emitting diode.

11. The light apparatus of claim 1, wherein the flat surface comprises a rectangular shape, and wherein the flat surface is comprised of a conductive material.

12. The light apparatus of claim 1, wherein the first section is electrically connected to the first electrically-conductive pad via direct contact.

13. The light apparatus of claim 1, wherein the direct contact comprises the first section pressed against the first electrically-conductive pad.

14. The light apparatus of claim 1, wherein the first electrically-conductive pad is disposed entirely on the surface of the PCB.

15. The light apparatus of claim 1, wherein the first electrically-conductive pad is positioned on a same surface of the first PCB as the first light emitting element.

16. A lighting apparatus comprising:
a first printed circuit board (PCB) including:
a first light emitting element;
a first electrically-conductive comprising a flat surface parallel to a surface of the first PCB; and
a socket component positioned at an end of the first PCB, wherein the socket component includes:
an insulative body having a recess formed therein; and
a first electrical contact having a first section formed adjacent to a surface of the first PCB and electrically connected to the first electrically-conductive pad, and a second section extending within the recess; and
a second PCB coupled to the first PCB in an end-to-end configuration, wherein the second PCB includes:
a second light emitting element;
a second electrically-conductive pad; and
a plug component positioned at the end of the second PCB, wherein the plug component includes:
a plug member extending outward from the end of the second PCB; and
a second electrical contact having a third section formed adjacent to a surface of the second PCB and electrically connected to the second electrically-conductive pad, and a fourth section positioned on a surface of the plug member,
wherein the socket component and the plug component each include surface mounting brackets positioned at respective bottom surfaces thereof, and wherein the surface mounting brackets are configured to mount the socket component and the plug component to the surface of the first PCB and the second PCB, respectively.

17. The lighting apparatus of claim 16, wherein the plug component is configured to seat within the socket component such that no gap is formed between the first PCB and the second PCB.

18. The lighting apparatus of claim 16, wherein the plug component further comprises a body member extending from a top surface of the second PCB such that the body member does not extend outward from an end of the second PCB, and wherein the plug member extends from a side of the body member.

19. The lighting apparatus of claim 18, wherein the plug member of the plug component extends to a lesser height from the top surface of the second PCB than the body member.

20. The lighting apparatus of claim 18, wherein the second electrical contact extends from a bottom surface of the body member through an opening in a side wall of the body member and into the plug member.

21. The light apparatus of claim 16, further comprising a light tube having a first end cap at a first end and a second end cap at a second end opposite the first end, wherein the first PCB and the second PCB are enclosed within the light tube.

22. The lighting apparatus of claim 21, wherein the first PCB is electrically connected to an electrical connector in the first end cap, and wherein the second PCB is electrically connected to an electrical connector in the second end cap.

23. The lighting apparatus of claim 22, wherein the first PCB includes a plug component having a same configuration as the plug component of the second PCB, wherein the plug component of the first PCB is connected to the electrical connector in the first end cap, wherein the second PCB includes a socket component having a same configuration as the socket component of the first PCB, and wherein the socket component of the second PCB is connected to the electrical connector in the second end cap.

24. The lighting apparatus of claim 21, wherein the lighting apparatus is configured for receipt in a fluorescent light fixture, and wherein the electrical connectors in the first end cap and the second end cap each comprise pin contacts configured for receipt in receptacles in the fluorescent light fixture.

* * * * *

UNITED STATES PATENT AND TRADEMARK OFFICE
CERTIFICATE OF CORRECTION

| | | |
|---|---|---|
| PATENT NO. | : 9,625,130 B2 | Page 1 of 1 |
| APPLICATION NO. | : 13/776856 | |
| DATED | : April 18, 2017 | |
| INVENTOR(S) | : Peter Bishop | |

It is certified that error appears in the above-identified patent and that said Letters Patent is hereby corrected as shown below:

Claim 16, Column 9, Line 13:

Insert missing word as shown:

a first electrically-conductive --pad-- comprising a flat surface

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*